United States Patent
Komiyama et al.

(10) Patent No.: US 7,115,977 B2
(45) Date of Patent: Oct. 3, 2006

(54) MULTI-CHIP PACKAGE TYPE SEMICONDUCTOR DEVICE

(75) Inventors: Mitsuru Komiyama, Tokyo (JP); Shinsuke Suzuki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/963,590

(22) Filed: Sep. 27, 2001

(65) Prior Publication Data

US 2002/0047213 A1 Apr. 25, 2002

(30) Foreign Application Priority Data

Sep. 28, 2000 (JP) ........................ 2000-296328

(51) Int. Cl.
- H01L 23/02 (2006.01)
- H01L 23/48 (2006.01)
- H01L 23/52 (2006.01)
- H01L 23/34 (2006.01)
- H01L 21/44 (2006.01)

(52) U.S. Cl. ................. 257/676; 257/686; 257/690; 257/695; 257/724; 257/777

(58) Field of Classification Search ....... 438/FOR. 426, 438/FOR. 368, 108; 257/686, 690, 695, 724, 257/777
See application file for complete search history.

(56) References Cited

U.S. PATENT DOCUMENTS

| | | | | |
|---|---|---|---|---|
| 4,903,114 A | * | 2/1990 | Aoki et al. | 257/666 |
| 5,091,825 A | * | 2/1992 | Hill et al. | 257/786 |
| 5,328,079 A | * | 7/1994 | Mathew et al. | 228/180.5 |
| 5,422,435 A | * | 6/1995 | Takiar et al. | 174/52.2 |
| 5,777,345 A | | 7/1998 | Loder et al. | 257/777 |
| 5,877,478 A | * | 3/1999 | Ando | 257/685 |
| 6,084,294 A | * | 7/2000 | Tomita | 257/476 |
| 6,148,505 A | * | 11/2000 | Fujishima | 29/740 |
| 6,169,331 B1 | * | 1/2001 | Manning et al. | 257/784 |
| 6,215,182 B1 | * | 4/2001 | Ozawa et al. | 174/52.4 |
| 6,229,217 B1 | * | 5/2001 | Fukui et al. | 257/685 |
| 6,376,904 B1 | * | 4/2002 | Haba et al. | 174/52.2 |
| 6,403,895 B1 | * | 6/2002 | Sota | 174/260 |
| 6,476,506 B1 | * | 11/2002 | O'Connor et al. | 257/786 |
| 2002/0158325 A1 | | 10/2002 | Yano et al. | 257/686 |

FOREIGN PATENT DOCUMENTS

| | | | | |
|---|---|---|---|---|
| JP | 02216839 A | * | 8/1990 | |
| JP | 02260551 A | * | 10/1990 | |
| JP | 06232196 A | * | 8/1994 | |
| JP | 07321142 A | * | 12/1995 | |
| JP | 08078467 A | * | 3/1996 | |
| JP | 2000-307057 | | 11/2000 | |
| JP | 2001-196529 | | 7/2001 | |
| WO | WO 97/257742 | | 7/1997 | |

* cited by examiner

Primary Examiner—David E. Graybill
(74) Attorney, Agent, or Firm—Junichi Mimura

(57) ABSTRACT

A multi-chip package type semiconductor device includes an insulating substrate having first and second conductive patterns thereon, a first semiconductor chip on the insulating substrate and having a first terminal pad and a relay pad isolated from the first terminal pad. The device further includes a second semiconductor chip on the first semiconductor chip having a second terminal pad. The first semiconductor chip is connected to the first pattern by a first bonding wire. The second semiconductor chip is connected to the second pattern by a second bonding wire, which connects the second pattern to the relay pad, and a third bonding wire, which connects the relay pad to the second terminal pad. The lengths of the first, second and third bonding wire are approximately the same.

26 Claims, 7 Drawing Sheets

MULTI-CHIP PACKAGE TYPE SEMICONDUCTOR DEVICE

CROSS-REFERENCE TO RELATED APPLICATION

This application claims the priority benefit of Japanese Patent Application No. 2000-296328, filed Sep. 28, 2000, the entire disclosure of which is incorporated herein by reference.

BACKGROUND OF THE INVENTION

1. Field of the invention

This invention relates to a semiconductor device, and more particularly, to a multi-chip package type semiconductor device in which more than one IC chip can be packaged.

2. Description of the related art

In the related art, there are several types of multi-chip packages in which more than one IC chip can be packaged. One typical multi-chip package is a stack type multi-chip package that packages at least two IC chips in a stacked manner.

In the stack type multi-chip package, the semiconductor device includes an insulating substrate, a first semiconductor chip formed on the insulating substrate and a second semiconductor chip, which is formed on the first semiconductor chip. Each of the semiconductor chips includes terminal pads, and the insulating substrate includes internal terminals. In the stack type multi-chip package, the terminal pads of the first semiconductor chip are connected to the internal terminals by a first conductive wire, and the, terminal pads of the second semiconductor chip are connected to the internal terminals by a second conductive wire. The insulating substrate, a first semiconductor chip and a second semiconductor chip are encapsulated by a sealing material, such as resin.

According to the stack type multi-chip package structure, since the second semiconductor chip is mounted on the first semiconductor chip, the distance between one of the terminal pads on the second semiconductor chip and one of the internal terminals, which is closest to the second semiconductor chip, is longer than that between one of the terminal pads on the first semiconductor chip and one of the internal terminals, which is closest to the first semiconductor chip. Therefore, the second conductive wire that connects the terminal pad of the second semiconductor chip to the internal terminal should be longer than the first conductive wire that connects the terminal pad of the first semiconductor chip to the internal terminal.

When the semiconductor device including conductive wires having the different lengths is encapsulated by the sealing material, the second conductive wire that is longer than the first conductive wire is pushed by injection pressure from the sealing material. As a result, the second conductive wire may contact an adjacent conductive wire so that circuits of the second semiconductor chip may short.

SUMMARY OF THE INVENTION

It is therefore an object of the invention to resolve the above-described problem in a multi-chip package type semiconductor device.

The object is achieved by a multi-chip package type semiconductor device including an insulating substrate having first and second conductive patterns thereon, a first semiconductor chip having a first internal circuit on the insulating substrate, the first semiconductor chip having a first terminal pad connecting to the first internal circuit and a conductive relay pad isolated from the first terminal pad, and the conductive relay pad including a first area and a second area, a second semiconductor chip on the first semiconductor chip, the second semiconductor chip being smaller than the first semiconductor chip, and having a second internal circuit and having a second terminal pad connecting to the second internal circuit, a first bonding wire connecting the first terminal pad to the first conductive pattern, a second bonding wire connecting the second conductive pattern to the conductive relay pad in the first area, and a third bonding wire connecting the conductive relay pad in the second area to the second terminal pad wherein the lengths of the first, second and third bonding wire are approximately the same.

The above and further objects and novel features of the invention will more fully appear from the following detailed description, appended claims and accompanying drawings.

DETAILED DESCRIPTION OF THE PREFERRED EMBODIMENTS

First Preferred Embodiment

Figure 1:
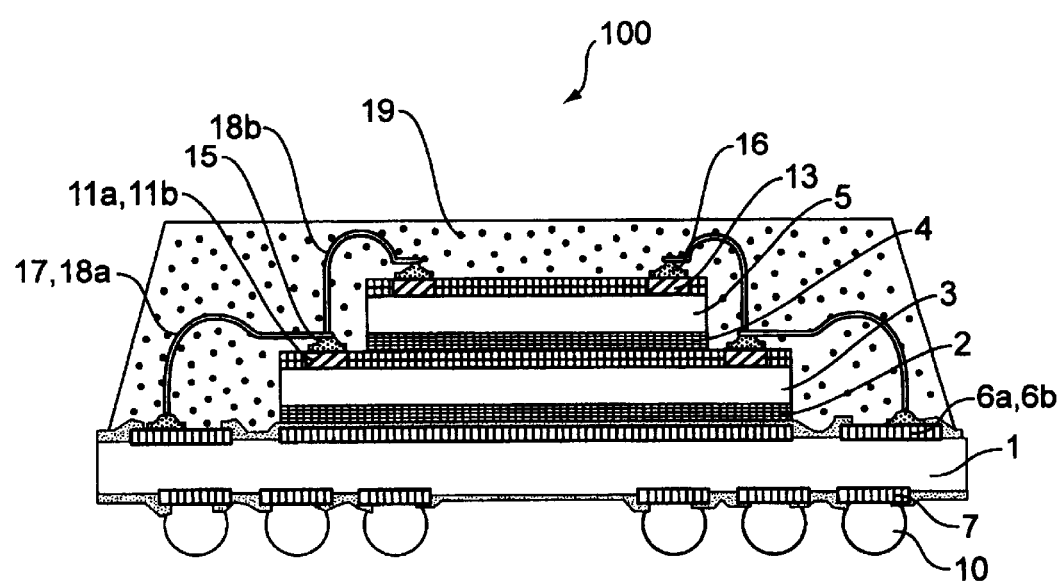
FIG. 1 is a sectional view of a multi-chip package type semiconductor device according to a first embodiment of the invention.

Referring to FIG. 1, a multi-chip package type semiconductor device includes an insulating substrate 1, a first semiconductor chip 3 and a second semiconductor chip 5. The first semiconductor chip 3 is fixed on the insulating substrate 1 by adhesive material 2. The second semiconductor chip 5 is smaller than the first semiconductor chip 3, and is fixed on the center of the first semiconductor chip 3 by adhesive material 4. First and second conductive patterns 6a, 6b acting as internal terminals are formed on the top surface of the insulating substrate 1, on which the first semiconductor chip 3 is mounted. a third conductive patterns 7 for connecting the semiconductor device 1 to an unillustrated external device electrically via a bump electrode 10 are formed on the back surface of the insulating substrate 1. The first conductive pattern 6a is formed in order to receive signals from the first semiconductor chip 3, and the second conductive pattern 6b is formed in order to receive signals from the second semiconductor chip 5. Each of the first and second conductive patterns 6a, 6b is electrically connected to one of the third conductive patterns 7 via a through-hole, which is formed in the insulating substrate 1.

Figure 2A:
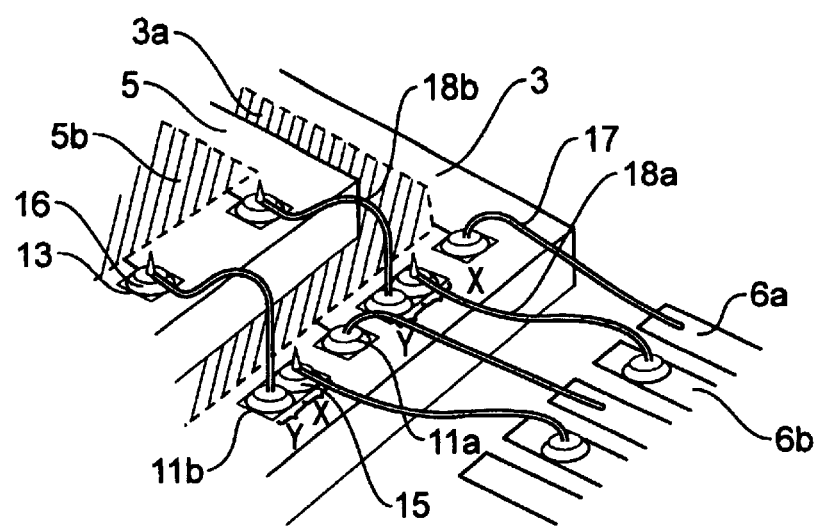
FIG. 2A is an enlarged perspective view of a corner of the multi-chip package type semiconductor device of FIG. 1.

Referring to FIG. 1 and FIG. 2A, the first semiconductor chip 3 includes a first terminal pad 11a and a relay pad 11b having a first area X and a second area Y on its top surface. The relay pad 11b is larger than the terminal pad 11a. The terminal pad 11a is connected to a first internal circuit 3a formed in the semiconductor chip 3, and the relay pad 11b is electrically isolated from the first internal circuit 3a and the first terminal pad 11a formed on the semiconductor chip 3. The second semiconductor chip 5 includes a second terminal pad 13, which is connected to a second internal circuit 5a formed on the semiconductor chip 5. As described above, since the second semiconductor chip 5 is smaller than the first semiconductor chip 3 and the second semiconductor chip 5 is mounted on the center of the first semiconductor chip 3, the first terminal pad 11a and the relay pad 11b can be formed on the periphery of the first semiconductor chip 3.

The top surface of the semiconductor chip 3, except for the first terminal pad 11a and the relay pad 11b, is covered by a passivation layer such as a silicon nitride layer, and therefore, the first terminal pad 11a and the relay pad 11b are exposed. The top surface of the semiconductor chip 5, except for the second terminal pad 13, is also covered by a passivation layer such as a silicon nitride layer, and therefore, the second terminal pad 13 is exposed.

Referring to FIG. 2A, a first metal bump 15 is formed on the relay pad 11b in the first area of the first semiconductor chip 3, and a second metal bump 16 is formed on each second terminal pad 13 of the second semiconductor chip 5. The first and second metal bumps 15, 16 can be formed according to the wire bonding technology.

The first conductive pattern 6a on the insulating substrate 1 is connected to the first terminal pad 11a by a first bonding wire 17 according to the following method. First, one end of the first bonding wire 17 is connected to the first terminal pad 11a by the well-known ball bonding method, as the first bond, which means a beginning connection. Then, the other end of the first bonding wire 17 is thermally pressed onto the first conductive pattern 6a, as the second bond, which means an ending connection.

The second conductive pattern 6b is connected to the second terminal pad 13 by a second bonding wire 18a and a third bonding wire 18b according the following method. First, one end of the second bonding wire 18a is connected to the second conductive pattern 6b by the ball bonding method, as the first bond. Then, the other end of the second bonding wire 18a is connected to the first metal bump 15, as the second bond. Second, one end of the third bonding wire 18b is connected to the relay pad in the second area Y by the ball bonding method, as the first bond. Then, the other end of the third bonding wire 18b is connected to the second metal bump 16, as the second bond. In this embodiment, although the connection between the second conductive pattern 6b and the first semiconductor chip 3 is made prior to the connection between the second terminal pad 13 on the second semiconductor chip 5 and the relay pad 11b on the first semiconductor chip 3, the connection between the second terminal pad 13 on the second semiconductor chip 5 and the relay pad 11b on the first semiconductor chip 3 may be made first. Since the distance between the second terminal pad 13 and the relay pad 11b equals the distance between the relay pad 11b and the second conductive pattern 6b, which equals the distance between the first terminal pad 11a and the first conductive pattern 6b, the lengths of the first, second and third bonding wires 17, 18a, 18b can be approximately the same.

Figure 2B:
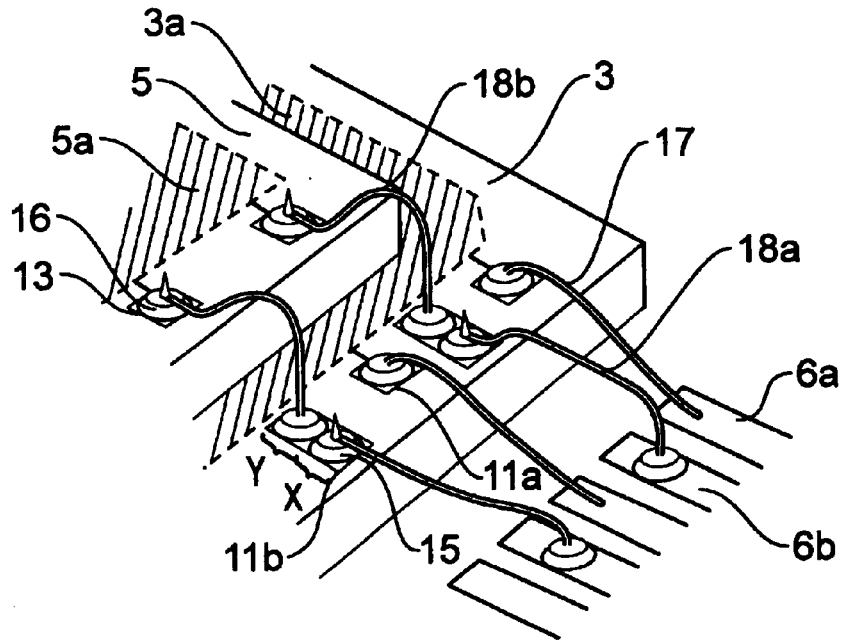
FIG. 2B is an enlarged perspective view of a corner of the multi-chip package type semiconductor device according to a first alternative embodiment of the first embodiment of the invention.

In the first embodiment, the relay pad 11b is formed in a rectangular shape, and its longer side is parallel to the side of the first semiconductor chip 3. However, it is possible to form the rectangularly-shaped relay pad 11b whose shorter side is parallel to the side of the first semiconductor chip 3 as shown in FIG. 2B. In this case, the second bonding wire 18a connects the second conductive pattern 6b to a first area X of the rectangularly-shaped relay pad 11b, which is relatively close to the side of the first semiconductor chip 3, and the third bonding wire 18b connects the second terminal pad 13 to a second area Y of the rectangularly-shaped relay pad 11b, which is relatively far to the side of the first semiconductor chip 3. Although the location where the second semiconductor chip 5 is mounted is restricted, it is possible to form each of the first and second wires 17 and 18a so as not to be formed perpendicular to the side of the semiconductor chips 3, in order to avoid the contact between the first and second wires 17 and 18a effectively.

Figure 2C:
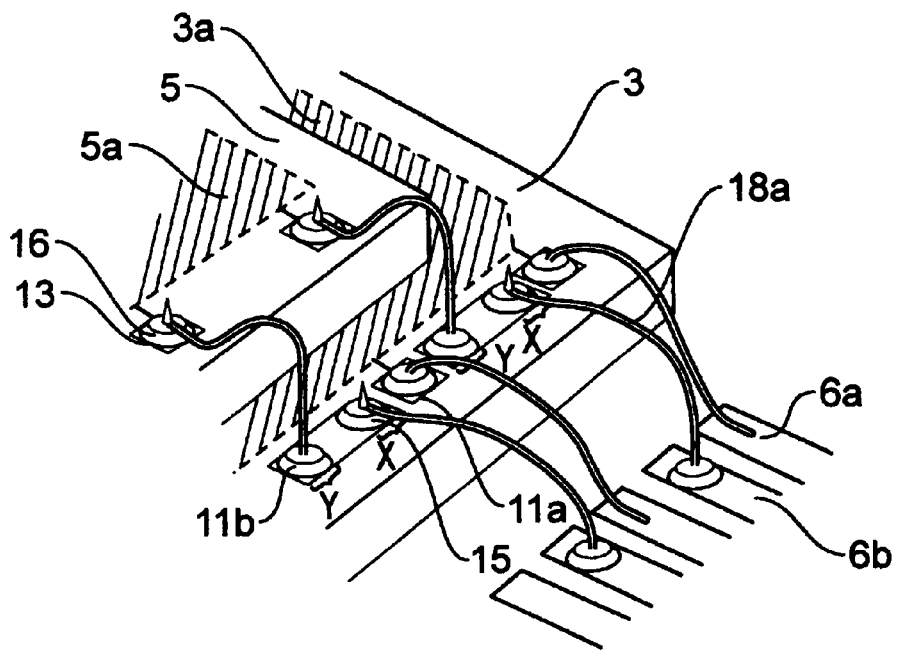
FIG. 2C is an enlarged perspective view of a corner of the multi-chip package type semiconductor device according to a second alternative embodiment of the first embodiment of the invention.

Further, the relay pad 11b can be formed large enough to space the first metal bump 15 from the one end of the third bonding wire 18b on the large relay pad 11b if the space allows, as shown in FIG. 2C. In this case, the flexibility in forming the second and third wires 18a, 18b is improved.

According to the first embodiment of the invention, the second terminal pad 13 of the second semiconductor chip 5 is not directly connected to the second conductive pattern 6b of the insulating substrate 1, and the second terminal pad 13 is connected to the second conductive pattern 6b via the relay pad 11b by using the second and third bonding wires 18a, 18b, each of which has approximately the same length as the first bonding wire 17. Therefore, it is not necessary to use a long bonding wire to connect the second terminal pad 13 to the second conductive pattern 6b in the first embodiment. As a result, it is possible to avoid unnecessary contact of the bonding wires, which are next to each other when the semiconductor device 100 is encapsulated by the sealing material.

Further, the relay pad 11b is formed larger than the first terminal pad 11a so that the first metal bump 15 is formed on the relay pad 11b in the first area X and the first bond of the third bonding wire can be made on the same relay pad 11b in the second area Y Therefore, since the second and third bonding wires 18a 18b can be connected in the different area in the relay pad 11b, stress of the wire bonding on the relay pad 11 can be reduced.

Moreover, since the first bond of the third bonding wire 18b is made on the relay pad 11b of the first semiconductor chip 3, and the second bond of the third bonding wire 18b is made on the second terminal pad 13 of the second semiconductor chip 5, the third bonding wire 18b having a low height wiring loop can be formed. Therefore, since the sealing material 19 can be thin, the thin package semiconductor device can be realized.

As described above, the entire surface of the relay pad 11 is exposed from the passivation layer. However, when the relay pad 11b is formed large enough to space the first metal bump 15 from the one end of the third bombing wire 18 on the large relay pad 11b, as shown in FIG. 2C, the passivation layer can be formed on the relay pad between the first metal bump 15 and the one end of the third bombing wire 18b.

Second Preferred Embodiment

The difference between the first and second embodiments is in the method the wire bonding to connect the first terminal pad 11a of the first semiconductor chip 3 or the second terminal pad 13 of the second semiconductor chip 5 to the first and second conductive patterns 6a, 6b.

Figure 3:
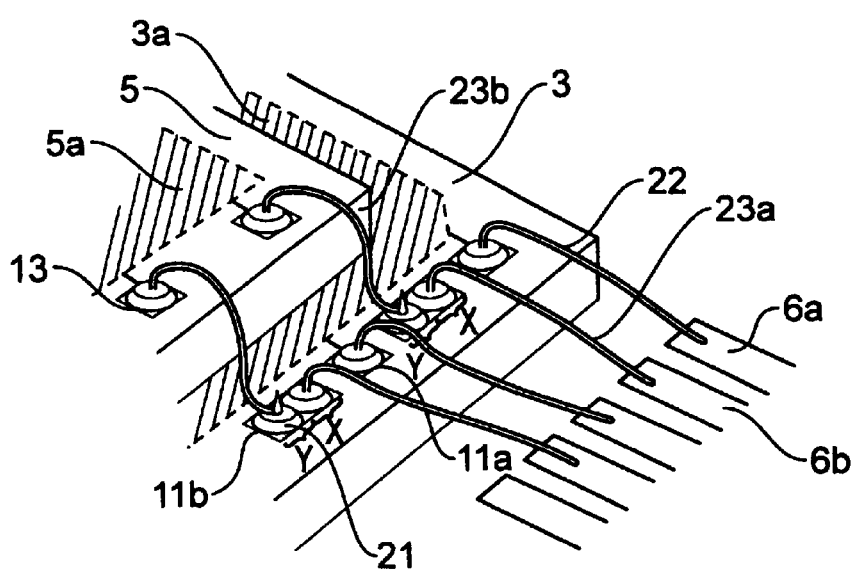
FIG. 3 is an enlarged perspective view of a corner of a multi-chip package type semiconductor device according to the second embodiment of the invention.

Referring to FIG. 3, a first metal bump 21 is formed on the relay pad 11b in the second area Y and no metal bump is formed on the second terminal pad 13 of the second semiconductor chip 5 and on the relay pad in the first area X of the first semiconductor chip 3. The connection between the first semiconductor chip 3 and the first conductive pattern 6a is made in the same way as described in the first embodiment. The connection between the second semiconductor chip 5 and the second conductive pattern 6b is made by the following method. The second conductive pattern 6b is connected to the second terminal pad 13 by a second bonding wire 23a and a third bonding wire 23b. First, one end of the second bonding wire 23a is connected to the relay pad 11b in the first area X by the ball bonding method, as the first bond. Then, the other end of the second bonding wire 23a is connected to the second conductive pattern 6b, as the second bond. Second, one end of the third bonding wire 23b is connected to the second terminal pad 13 of the second semiconductor chip 5 by the ball bonding method, as the first bond. Then, the other end of the third bonding wire 23b is connected to the metal bump 21 formed on the relay pad 11b in the second area Y as the second bond.

According to the second embodiment, since the first bond of the third wire 23b is made at the second terminal pad 13 by the ball bonding method, it is not necessary to form any metal bumps on the second terminal pad 13. Therefore, in addition to the benefits of the first embodiment, it is possible to delete the process of forming the metal bumps on the second terminal pad 13.

Third Preferred Embodiment

A semiconductor device 200 of the third embodiment is explained below with reference to FIGS. 4 and 5. The same reference numbers in FIGS. 1–3 designate the same or similar components in FIGS. 4 and 5.

Figure 4:
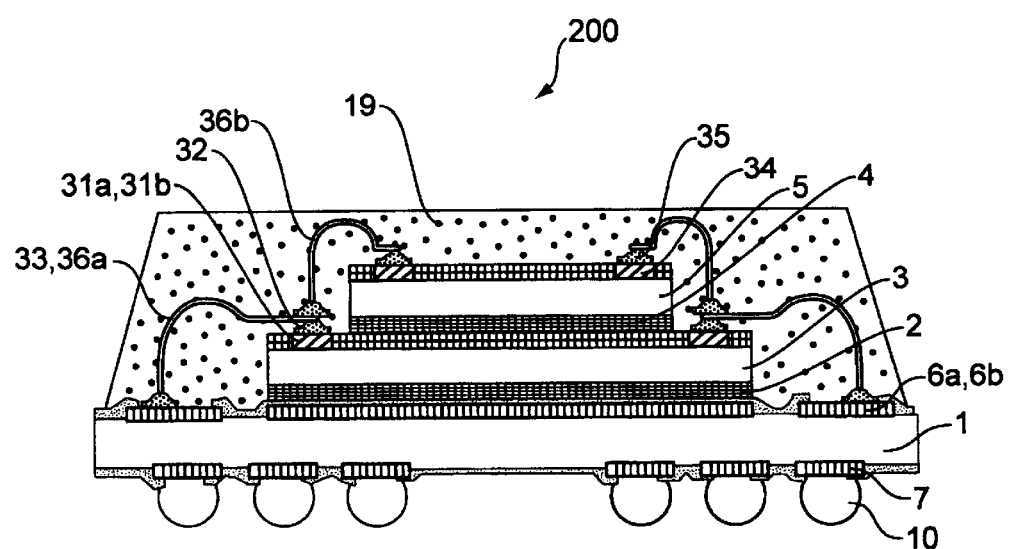
FIG. 4 is a sectional view of a multi-chippackage type semiconductor device according to a third embodiment of the invention.
Figure 5:
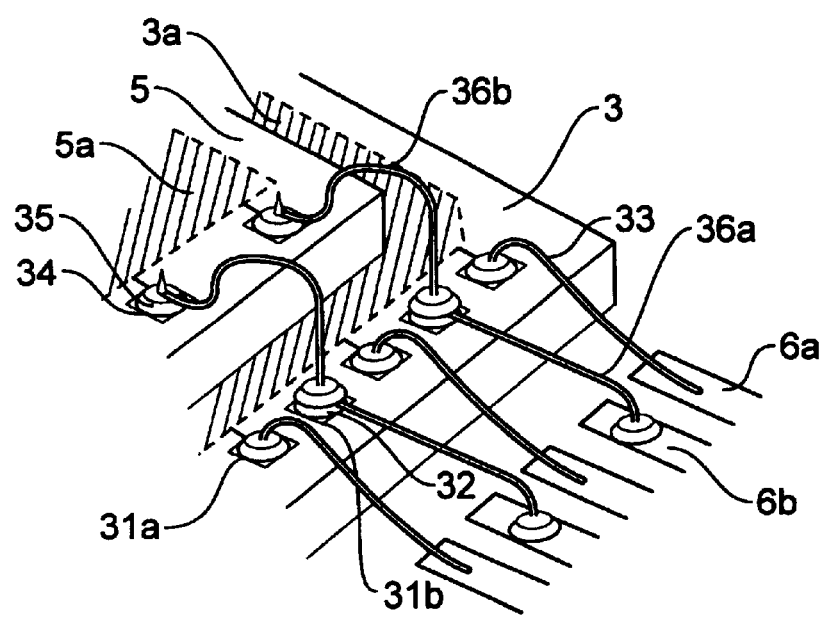
FIG. 5 is an enlarged perspective view of a corner of the multi-chip package type semiconductor device of FIG. 4.

Referring to FIGS. 4 and 5, a first semiconductor chip 3 includes a first terminal pad 31a and a relay pad 31b, as in the first and second embodiments. However, the size of the first terminal pad 31a almost equals that of the relay pad 31b in the third embodiment. The first terminal pad 31a is connected to a first internal circuit 3a of the first semiconductor chip 3 and the relay pad 31b is isolated electrically from the first terminal pad 31a and the first internal circuit 3a of the first semiconductor chip 3. A first metal bump 32 is formed on the relay pad 31b, and the surface of the first terminal pad 31a is exposed.

A second semiconductor chip 5, which is fixed on the first semiconductor chip 3, includes a second terminal pad 34, which connects to a second internal circuit 5a. A second metal bump 35 is formed on the second terminal pad 34.

The first semiconductor chip 3 is connected to a first conductive pattern 6a formed on an insulating substrate 1 by a first bonding wire 33. The method of connecting the first semiconductor chip 3 to the first conductive pattern 6a is the same as that described in the first embodiment. That is, the first bond of the first bonding wire 33 by the ball bonding method is made at the first terminal pad 31b, and the second bond of the first bonding is made at the first conductive pattern 6a.

The second semiconductor chip 5 is connected to a second conductive pattern 6b formed on the insulating substrate 1 by second and third bonding wires 36a, 36b in the following method. First, one end of the second bonding wire 36a is connected to the second conductive pattern 6b by the ball bonding method, as the first bond. Then, the other end of the second bonding wire 36a is connected to the first metal bump 32 on the relay pad 31b, as the second bond. Second, one end of the third bonding wire 36b is connected to the first metal bump 32 on which the other end of the second bonding wire 36a is connected, by the ball bonding method, as the first bond. Then, the other end of the third bonding wire 36b is connected to the second metal bump 35, as the second bond.

According to the third embodiment, in addition to the benefits of the first embodiment, the following benefit can be expected. Since the first bond of the third bonding wire 36b is made on the second bond of the second bonding wire 36a, it is not necessary to form the large relay pad, such as the relay pad 11b shown in FIGS. 2A through 2C and 3. Therefore, space between the relay pad 31b and the first terminal pad 31a can be secured enough.

Fourth Preferred Embodiment

The difference between the third and fourth embodiment is a method of the wire bonding to connect a first terminal pad 41a of the first semiconductor chip 3 or a second terminal pad 44 of the second semiconductor chip 5 to the first and second conductive patterns 6a, 6b. So, the same reference numbers in FIG. 4 designate the same or similar components in the fourth embodiment shown in FIG. 6.

Figure 6:
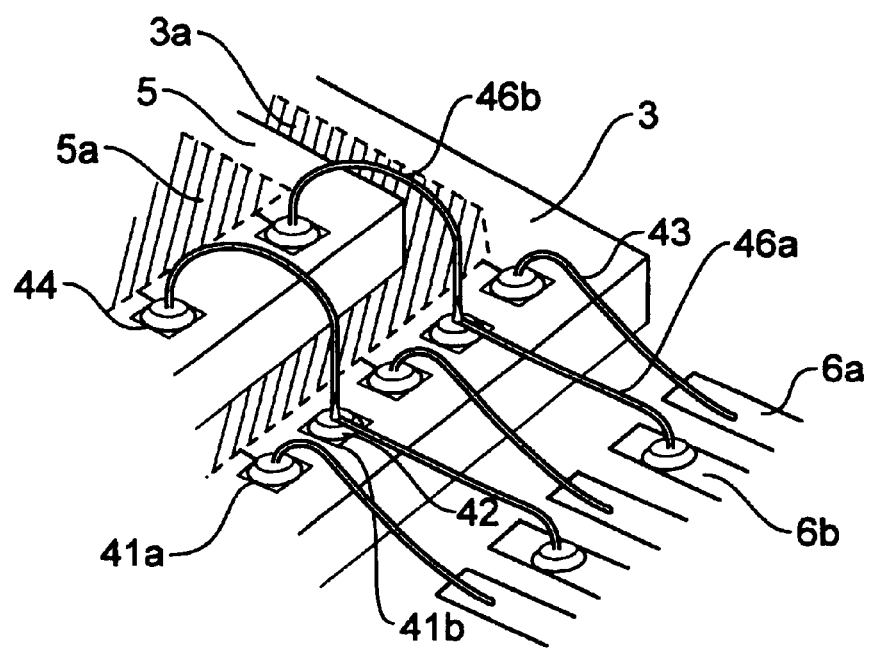
FIG. 6 is an enlarged perspective view of a corner of a multi-chip package type semiconductor device according to the fourth embodiment of the invention.

Referring to FIG. 6, a first metal bump 42 is formed on the relay pad 41b and no metal bump is formed on the first and second terminal pads 41b, 44 on the first and second semiconductor chips 3, 5. The connection between the first semiconductor chip 3 and the first conductive pattern 6a is made using a first bonding wire 43 in the same way as described in the third embodiment. The connection between the second semiconductor chip 5 and the second conductive pattern 6b is made by the following method. The second conductive pattern 6b is connected to the second terminal pad 44 by a second bonding wire 46a and a third bonding wire 46b. First, one end of the third bonding wire 46b is connected to the second terminal pad 44 by the ball bonding method, as the first bond. Then, the other end of the third bonding wire 46b is connected to the first metal bump 42, as the second bond. Second, one end of the second bonding wire 46a is connected to the second conductive pattern 6b by the ball bonding method, as the first bond. Then, the other end of the second bonding wire 36a is connected to the first metal bump 42 on the relay pad 41b, as the second bond. In this embodiment, although the connection between the second terminal pad 44 on the second semiconductor chip 5 and the relay pad 41b on the first semiconductor chip is made prior to the connection between the second conductive pattern 6b and the first semiconductor chip 3, the connection between the second conductive pattern 6b and the first semiconductor chip 3 may be made first. In either way, the second bonds of both of the second and third bonding wire 46a, 46b are made on the first metal bump 42.

According to the fourth embodiment, since the second bonds of both of the second and third bonding wire 46a, 46b are made on the first metal bump 42, it is not necessary to form any metal bumps on the second terminal pad 44. Therefore, in addition to the benefits of the third embodiment, it is possible to delete the process of forming the metal bumps on the second terminal pad 13.

Various other modifications of the illustrated embodiments, as well as other embodiments of the invention, will be apparent to those skilled in the art on reference to this description. For example, in all embodiments, the semiconductor chip 3 is fixed on the insulating substrate 1. However, the invention can be applied to the multi-chip package type semiconductor devices formed on the lead frame. In this case, a inner lead is used instead of conductive pattern 6a, 6b, and the first semiconductor is fixed on a die pad of the lead frame. Therefore, the appended claims are intended to cover any such modifications or embodiments as fall within the true scope of the invention.

What I claim is:

1. A multi-chip package type semiconductor device, comprising:

an insulating substrate having thereon a first conductive pattern and a second conductive pattern;

a first semiconductor chip having a plurality of first internal circuits on the insulating substrate, the first semiconductor chip having a plurality of first terminal pads, each of which is connected to one of the first internal circuits and a plurality of conductive relay pads, each of which is isolated from the first terminal pads, and each of the conductive relay pads including a first area and a second area, which is different from the first area, wherein each first terminal pad and each conductive relay pad are alternatively aligned;

a second semiconductor chip on the first semiconductor chip, the second semiconductor chip being smaller than the first semiconductor chip, and having a second internal circuit and having a second terminal pad connecting to the second internal circuit;

a plurality of first metal bumps, each of which is formed on one of the conductive relay pads in the first area;

a second metal bump formed on the second terminal pad;

a first bonding wire, wherein one end thereof is formed on one of the first terminal pads and the other end is formed on the first conductive pattern;

a second bonding wire, wherein one end thereof is formed on the second conductive pattern and the other end is formed at the top of the first metal bump on one of the conductive relay pads in the first area; and a third bonding wire, wherein one end thereof is formed on the one of the conductive relay pads in the second area and the other end is formed at the top of the second metal bump, wherein the lengths of the first, second and third bonding wire are approximately the same.

2. A multi-chip package type semiconductor device, as claimed in claim 1, wherein the second semiconductor chip is placed on the center of the first semiconductor chip.

3. A multi-chip package type semiconductor device, as claimed in claim 2, wherein each of the conductive relay pads is rectangularly-shaped, and is formed on a periphery of the first semiconductor chip and a longer side of the rectangularly-shaped conductive relay pad is parallel to a side of the first semiconductor chip, wherein a distance from the side of the first semiconductor chip to the first area is almost the same as that from the side of the first semiconductor chip to the second area.

4. A multi-chip package type semiconductor device, as claimed in claim 2, wherein one of the conductive relay relay pads is rectangularly-shaped, and is formed on a periphery of the first semiconductor chip, and a shorter side of the rectangularly-shaped conductive relay pad is parallel to a side of the first semiconductor chip.

5. A multi-chip package type semiconductor device, as claimed in claim 4, wherein the first area of the rectangularly-shaped conductive relay pad is closer to the side of the first semiconductor chip than the second area.

6. A multi-chip package type semiconductor device, as claimed in claim 2, wherein the first metal bump is spaced apart from the one end of the third bonding wire, but is electrically connected to the one end of the third bonding wire via the conductive relay pad.

7. A multi-chip package type semiconductor device, comprising:

a first semiconductor chip having a plurality of first terminal pads and a plurality of conductive relay pads, each of the conductive relay pads including a first area and a second area, which is different from the first area, wherein each first terminal pad and each conductive relay pad are alternatively aligned;

a second semiconductor chip, which is placed on the first semiconductor chip, the second semiconductor chip having a second terminal pad, connected to one of the conductive relay pads in the second area;

a plurality of first metal bumps, each of which is formed on one of the conductive relay pads in the first area;

a second metal bump formed on the second terminal pad;

a first internal terminal connected to one of the first terminal pads;

a second internal terminal connected to one of the conductive relay pads in the first area;

a first bonding wire, wherein one end thereof is formed on the first internal terminal and the other end is formed on one of the first terminal pads;

a second bonding wire, wherein one end thereof is formed on the second internal terminal and the other end is formed at the top of the first metal bump formed on one of the conductive relay pads; and a third bonding wire, wherein one end thereof is formed on the one of the conductively relay pads in the second area and the other end is formed at the top of the second metal bump.

8. A multi-chip package type semiconductor device, as claimed in claim 7, further comprising an insulating substrate, wherein the first and second internal terminals are formed on the insulating substrate, and the first semiconductor chip is placed on the insulating substrate.

9. A multi-chip package type semiconductor device, comprising:

an insulating substrate having a first and second conductive patterns thereon;

a first semiconductor chip on the insulating substrate, the first semiconductor chip having a plurality of first internal circuits, a plurality of first terminal pads, each of which is connected to one of the first internal circuits and a plurality of conductive relay pads, each of which is isolated from the first terminal pads, wherein each first terminal pad and each conductive relay pad are alternatively aligned;

a second semiconductor chip on the first semiconductor chip, the second semiconductor chip being smaller than the first semiconductor chip, and having a second internal circuit and having a second terminal pad connecting to the second internal circuit;

a plurality of first metal bumps, each of which is formed on one of the conductive relay pads;

a second metal bump formed on the second terminal pad;

a first bonding wire, wherein one end thereof is formed on one of the first terminal pads and the other end is formed on the first conductive pattern;

a second bonding wire, wherein one end thereof is formed on the second conductive pattern and the other end is formed at the top of one of the first metal bumps; and a third bonding wire, wherein one end thereof is formed at the top of the one of the first metal bumps and the other end is formed at the top of the second metal bump;

wherein the lengths of the first, second and third bonding wire are approximately the same.

10. A multi-chip package type semiconductor device, as claimed in claim 9, wherein the second semiconductor chip is placed on the center of the first semiconductor chip.

11. A multi-chip package type semiconductor device, comprising:

an insulating substrate having a first and second conductive patterns thereon;

a first semiconductor chip on the insulating substrate, the first semiconductor chip having a plurality of first internal circuits, a plurality of first terminal pads, each of which is connected to one of the first internal circuits and a plurality of conductive relay pads, each of which is isolated from the first terminal pads, wherein each first terminal pad and each conductive relay pad are alternatively aligned;

a semiconductor chip on the first semiconductor chip, the second semiconductor chip being smaller than the first semiconductor chip, and having a second internal circuit and having a second terminal pad connecting to the second internal circuit;

a plurality of metal bumps, each of which is formed on one of the conductive relay pads;

a first bonding wire, wherein one end thereof is formed on one of the first terminal pads and the other end is formed on the first conductive pattern;

a second bonding wire, wherein one end thereof is formed on the second conductive pattern and the other end is formed at the top of one of the metal bumps; and a third bonding wire, wherein one end thereof is formed on the second terminal pad and the other end is formed at the top of the one of the metal bumps;

wherein the lengths of the first, second and third bonding wire are approximately the same.

12. A multi-chip package type semiconductor device, as claimed in claim 7, wherein the first area and the second area are located along a side of the first semiconductor chip.

13. A multi-chip package type semiconductor device, comprising:

a first semiconductor chip having a plurality of first conductive portions and a plurality of second conductive portions, each of which has a first area and a second area, which is different from the first area, wherein each first conductive portion and each second conductive portion are alternatively aligned;

a second semiconductor chip, which is placed on the first semiconductor chip, the second semiconductor chip having a third consecutive portion, connected to one of the second conductive portion in the first area;

a plurality of bumps, each of which is formed on one of second conductive portions in the second area;

a first internal terminal connected to one of the first conductive portions;

a second internal terminal connected to one of the second conductive portions in the second area; and a wire, wherein one end thereof is formed on the second internal terminal and the other end is formed at the top of the one of the bumps.

14. A multi-chip package type semiconductor device, as claimed in claim 13, wherein the first area and the second area are located along a side of the first semiconductor chip.

15. A multi-chip package type semiconductor device, as claimed in claim 13, further comprising an insulating substrate, wherein the first and second internal terminals are formed on the insulating substrate, and the first semiconductor chip is placed on the insulating substrate.

16. A multi-chip package type semiconductor device, as claimed in claim 13, wherein the first area and the second area are spaced from each other.

17. A multi-chip package type semiconductor device, as claimed in claim 1, wherein each of the first terminal pads is rectangularly-shaped, and a side of the first terminal pad is parallel to the side of the first semiconductor chip.

18. A multi-chip package type semiconductor device, as claimed in claim 7, wherein each of the first terminal pads is rectangularly-shaped, and a side of the first terminal pad is parallel to a side of the first semiconductor chip.

19. A multi-chip package type semiconductor device, as claimed in claim 9, wherein each of the first terminal pads is rectangularly-shaped, and a side of the first terminal pad is parallel to the side of the first semiconductor chip.

20. A multi-chip package type semiconductor device, as claimed in claim 13, wherein each of the first conductive portions is rectangularly-shaped, and a side of the first conductive portion is parallel to the side of the first semiconductor chip.

21. A multi-chip package type semiconductor device, comprising:

an insulating substrate having thereon a first conductive pattern and a second conductive pattern;

a first semiconductor chip having a plurality of first internal circuits on the insulating substrate, the first semiconductor chip having a plurality of first terminal pads, each of which is connected to one of the first internal circuits and a plurality of conductive relay pads, each of which is isolated from the first terminal pads, and each of which includes a first area and a second area which is different from the first area, each first terminal pad and each conductive relay pad are alternatively aligned;

a second semiconductor chip on the first semiconductor chip, the second semiconductor chip being smaller than the first semiconductor chip, and having a second internal circuit and having a second terminal pad connecting to the second internal circuit;

a plurality of metal bumps, each of which is formed on one of the conductive relay pads in the second area;

a first bonding wire, wherein one end thereof is formed on one of the first terminal pads and the other end is formed on the first conductive pattern;

a second bonding, wherein one end thereof is formed on the second conductive pattern and the other end is formed on one of the conductive relay pads in the first area; and a third bonding wire, wherein one end thereof is formed on the second terminal pad and the other end is formed at the top of the metal bump on the one of the conductive relay pads in the second area;

wherein the lengths of the first, second and third bonding wire are approximately the same.

22. A multi-chip package type semiconductor device, as claimed in claim 21, wherein the second semiconductor chip is placed on the center of the first semiconductor chip.

23. A multi-chip package type semiconductor device, as claimed in claim 22, wherein each of the conductive relay pads is rectangularly-shaped, and is formed on a periphery of the first semiconductor chip, and a longer side of the rectangularly-shaped conductive relay pad is parallel to a side of the first semiconductor chip, wherein a distance from the side of the first semiconductor chip to the first area is almost the same as that from the side of the first semiconductor chip to the second area.

24. A multi-chip package type semiconductor device, as claimed in claim 22, wherein each of the conductive relay pads is rectangularly-shaped, and is formed on a periphery of the first semiconductor chip, and a shorter side of the rectangularly-shaped conductive relay pad is parallel to a side of the first semiconductor chip.

25. A multi-chip package type semiconductor device, as claimed in claim 24, wherein the first area of the rectangularly-shaped conductive relay pad is closer to the side of the first semiconductor chip than the second area.

26. A multi-chip package type semiconductor device, as claimed in claim 22, wherein each of the metal bumps is spaced apart from the one end of the second bonding wire, but is electrically connected to the one end of the second bonding wire via the conductive relay pad.

* * * * *